(12) United States Patent
Chen

(10) Patent No.: US 10,283,064 B2
(45) Date of Patent: May 7, 2019

(54) LIQUID CRYSTAL DISPLAY, DEVICE AND CONNECTION STRUCTURE OF DISPLAY PANEL AND SYSTEM CIRCUIT

(71) Applicants: HKC Corporation Limited, Shenzhen (CN); Chongqing HKC Optoelectronics Technology Co., ltd., Chongqing (CN)

(72) Inventor: Yu-Jen Chen, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 15/845,242

(22) Filed: Dec. 18, 2017

(65) Prior Publication Data

US 2018/0190225 A1 Jul. 5, 2018

Related U.S. Application Data

(63) Continuation of application No. PCT/CN2017/102467, filed on Sep. 20, 2017.

(30) Foreign Application Priority Data

Dec. 30, 2016 (CN) .......................... 2016 1 1257866

(51) Int. Cl.
*G09G 3/36* (2006.01)
*G09G 3/30* (2006.01)
*G02F 1/1345* (2006.01)
*G02F 1/1362* (2006.01)
*G09G 3/20* (2006.01)

(52) U.S. Cl.
CPC ....... *G09G 3/3666* (2013.01); *G02F 1/13452* (2013.01); *G02F 1/136286* (2013.01); *G09G 3/2092* (2013.01); *G09G 3/3607* (2013.01)

(58) Field of Classification Search
CPC ................................ G09G 2300/00–2300/089
See application file for complete search history.

(56) References Cited

U.S. PATENT DOCUMENTS

| | | | | |
|---|---|---|---|---|
| 2005/0157244 A1* | 7/2005 | Hwang | ............... | H01L 23/4824 349/151 |
| 2007/0268441 A1* | 11/2007 | Liu | ..................... | G02F 1/13452 349/149 |
| 2012/0299888 A1* | 11/2012 | Kim | ..................... | G02F 1/13452 345/205 |

* cited by examiner

*Primary Examiner* — Sanghyuk Park
(74) *Attorney, Agent, or Firm* — WPAT, PC

(57) ABSTRACT

A connection structure of display panel and system circuit is provided. The disclosure also provides a liquid display panel and a liquid display device. The connection structure includes an array substrate, a printed circuit board, and a plurality of electrically conductive particles. The array substrate provides a plurality of signal lines in a display portion thereof and provides a plurality of traces in a fan-out portion thereof. The signal lines at least includes a first signal line and a second signal line at different height layers. The traces at least includes a first trace and a second trace at different height layers. One end of each trace is electrically connected with one signal line, and the other end of each trace is electrically connected with one conductive line via electrically conductive particles.

20 Claims, 4 Drawing Sheets

LIQUID CRYSTAL DISPLAY, DEVICE AND CONNECTION STRUCTURE OF DISPLAY PANEL AND SYSTEM CIRCUIT

FIELD OF THE DISCLOSURE

The disclosure relates to liquid crystal display technical field, and more particularly to a liquid crystal display, a liquid crystal device, and a connection structure of a display panel and a system circuit.

BACKGROUND

An array substrate of the liquid crystal display (LCD) has a display area and a fan-out area. There are signal lines integrated on the display area for driving the source and the gate on the display area. The fan-out area defines traces, a start end of the trace is soldered with the signal line, and an output end of the trace is electrically connected with conductive lines of the printed circuit board via anisotropic conductive film (ACF). The flexible printed circuit board is electrically connected to the system circuit board, so that an electrical connection is achieved between the display area and the system circuit. It is noted that, through the vertical conductive principle of the electrically conductive particles of the ACF, the output end of trace and the conductive lines of the flexible printed circuit board constitute the electrical connection.

The design of the output ends of the generally fan-out areas is limited by the particle size of the ACF electrically conductive particles, the distance between the conductive lines of the flexible circuit board, and the ability of pressing device. At present, large-size LCD array substrate is designed as a single row layout, and small and medium size LCD array substrate is designed as two rows layout, due to its high integrated circuit density. However, at higher resolution specifications and narrow bezel design requirements, the signal lines and trace structures on the array substrate, the layout of the flexible circuit board, the ACF application material, or the pressing device all need to be updated to cope with the challenges of high density integrated circuits.

SUMMARY

The present invention provides a liquid crystal panel, a liquid crystal device, and a connection structure of display panel and system circuit. The present invention is intended to solve a problem that the prior art connection structure can not satisfy the higher density integrated circuit of a medium-sized LCD.

One embodiment of the present invention provides a connection structure. The connection structure comprises an array substrate, a printed circuit board, and a plurality of electrically conductive particles. The array substrate comprises a display portion and a fan-out portion. The display portion provides a plurality of signal lines. The plurality of signal lines at least comprises a first signal line and a second signal line positioned at different height layers, the first and second signal lines are insulated from each other. The fan-out portion provides a plurality of traces corresponding to the signal lines one by one, the plurality of traces at least comprises a first trace and a second trace positioned at different height layers, and the first and second traces are insulated from each other. The printed circuit board comprises a plurality of conductive lines spaced from each other. One end of each trace is electrically connected with one corresponding signal line, and the other end of each trace is electrically connected with one conductive line via electrically conductive particles.

Further, the printed circuit board is a flexible printed circuit board.

Further, the connection structure further comprises a system circuit board, which provides a plurality of conductive traces electrically communicated with the conductive lines.

Further, the display portion defines a peripheral soldering area, and the signal lines are positioned at the soldering area.

Further, the signal lines are arranged along a row at the soldering area.

Further, the first signal line and the second signal line are adjacent.

Further, the display portion defines a first soldering area and an adjacent second soldering area, half signal lines are arranged along a first row at the first soldering area, and the other half signal lines arranged along a second row at the second soldering area.

Further, the first soldering area and the second soldering area are positioned at different height layers.

Further, the first signal line is positioned at the first soldering area, and the second signal line is positioned at the second soldering area.

Further, the electrically conductive particles are positioned in an anisotropic conductive adhesive layer, in which the electrically conductive particles are insulated from each other by insulation material surrounded each electrically conductive particle, and the anisotropic conductive adhesive layer is positioned sandwiched between the conductive lines and the traces.

Further, the electrically conductive particles have the same diameter.

Further, the electrically conductive particles have the same diameter and are positioned in an anisotropic conductive adhesive layer, the electrically conductive particles are insulated from each other by insulation material surrounded each electrically conductive particle.

Further, the electrically conductive particles have two different diameters, and the conductive lines are positioned at the same layer of the printed circuit board.

Further, an insulation layer surrounds and covers each of the electrically conductive particles.

Further, the first trace and the second trace are positioned at two neighbor layers, and the projections of the first trace and the second trace are overlapped.

Further, the first trace and the second trace are positioned at two neighbor layers, and the projection of the first trace is adjacent to the projection of the second trace.

One embodiment of the present invention provides a liquid crystal display panel. The liquid crystal display panel comprises an array substrate, an opposite substrate, a liquid crystal layer, a first polarizing plate and a second polarizing plate. An inner side of the array substrate provides a first electrode layer having transistors and a first alignment layer covering the first electrode layer. The first electrode layer defines a display portion and a fan-out portion. The display portion provides a plurality of signal lines, the plurality of signal lines at least comprises a first signal line and a second signal line positioned at different height layers. The fan-out portion provides a plurality of traces corresponding to the signal lines one by one, the plurality of traces at least comprises a first trace and a second trace positioned at different height layers, and the first and second traces are insulated from each other. An inner side of the opposite substrate provides a second electrode layer and a second alignment layer covering the second electrode layer. The liquid crystal layer is positioned between the first alignment layer and the second alignment layer. The first polarizing plate is positioned at the outer side of the array substrate. The second polarizing plate is positioned at the outer side of the opposite substrate.

One embodiment of the present invention provides a liquid crystal display device. The liquid crystal display device comprises an array substrate, an opposite substrate, a liquid crystal layer, a first polarizing plate, a second polarizing plate, and a backlight module. An inner side of the array substrate provides a first electrode layer having transistors and a first alignment layer covering the first electrode layer. The first electrode layer defines a display portion and a fan-out portion. The display portion provides a plurality of signal lines, the plurality of signal lines at least comprises a first signal line and a second signal line positioned at different height layers. The fan-out portion provides a plurality of traces corresponding to the signal lines one by one, the plurality of traces at least comprises a first trace and a second trace positioned at different height layers, and the first and second traces are insulated from each other. An inner side of the opposite substrate provides a second electrode layer and a second alignment layer covering the second electrode layer. The liquid crystal layer is positioned between the first alignment layer and the second alignment layer. The first polarizing plate is positioned at the outer side of the array substrate. The second polarizing plate is positioned at the outer side of the opposite substrate. The backlight module is configured for providing backlighting.

Further, the liquid crystal display device further comprises a printed circuit board and a plurality of electrically conductive particles, the printed circuit board comprises a plurality of conductive lines spaced from each other, one end of each trace is electrically connected with one corresponding signal line, and the other end of each trace is electrically connected with one conductive line via the electrically conductive particles.

Further, the first polarizing plate is sandwiched between the backlight module and the array substrate.

In the connection structure provided by the present embodiment, the first signal line and the second signal line are positioned at different height layers, the first trace and the second trace are positioned at different height layers. As such, an up and down staggered wiring structure is formed, and the wiring density is improved. In a same wiring area, the present embodiment achieves at least twice the resolution of integrated circuit requirements compared to conventional designs, and enables a narrower frame design of medium and small size LCD panels to achieve higher resolution.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

Figure 1:
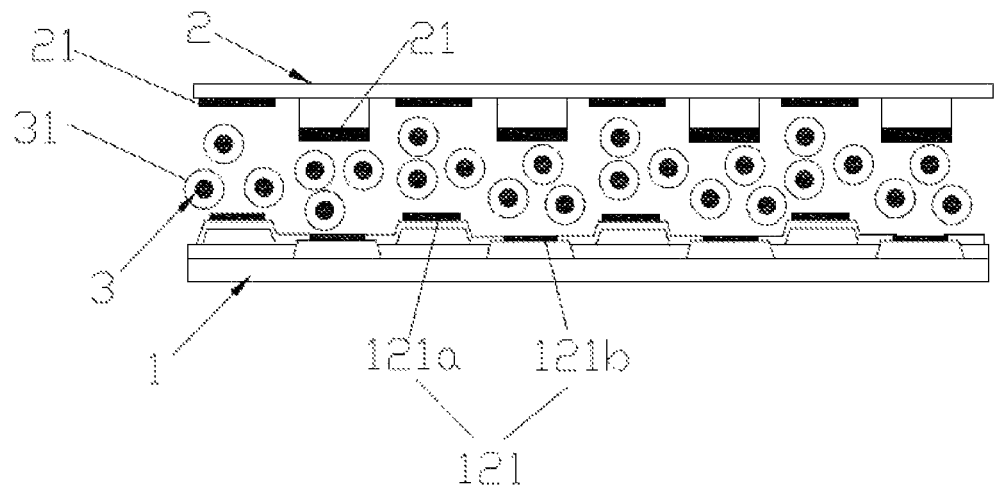
FIG. 1 is a structural schematic view of an connection structure, in which an array substrate and a flexible printed circuit board are communicated with the same diameter electrically conductive particles, according to an embodiment of the disclosure.

The specific structural and functional details disclosed herein are only representative and are intended for describing exemplary embodiments of the disclosure. However, the disclosure can be embodied in many forms of substitution, and should not be interpreted as merely limited to the embodiments described herein.

In the description of the disclosure, terms such as "center", "transverse", "above", "below", "left", "right", "vertical", "horizontal", "top", "bottom", "inside", "outside", etc. for indicating orientations or positional relationships refer to orientations or positional relationships as shown in the drawings; the terms are for the purpose of illustrating the disclosure and simplifying the description rather than indicating or implying the device or element must have a certain orientation and be structured or operated by the certain orientation, and therefore cannot be regarded as limitation with respect to the disclosure. Moreover, terms such as "first" and "second" are merely for the purpose of illustration and cannot be understood as indicating or implying the relative importance or implicitly indicating the number of the technical feature. Therefore, features defined by "first" and "second" can explicitly or implicitly include one or more the features. In the description of the disclosure, unless otherwise indicated, the meaning of "plural" is two or more than two. In addition, the term "comprise" and any variations thereof are meant to cover a non-exclusive inclusion.

In the description of the disclosure, is should be noted that, unless otherwise clearly stated and limited, terms "mounted", "connected with" and "connected to" should be understood broadly, for instance, can be a fixed connection, a detachable connection or an integral connection; can be a mechanical connection, can also be an electrical connection; can be a direct connection, can also be an indirect connection by an intermediary, can be an internal communication of two elements. A person skilled in the art can understand concrete meanings of the terms in the disclosure as per specific circumstances.

The terms used herein are only for illustrating concrete embodiments rather than limiting the exemplary embodiments. Unless otherwise indicated in the content, singular forms "a" and "an" also include plural. Moreover, the terms "comprise" and/or "include" define the existence of described features, integers, steps, operations, units and/or components, but do not exclude the existence or addition of one or more other features, integers, steps, operations, units, components and/or combinations thereof.

The disclosure will be further described in detail with reference to accompanying drawings and preferred embodiments as follows.

Referring to FIG. 1 to FIG. 5, according to an embodiment of the present disclosure, a connection structure between a display panel and a system circuit is provided. The connection structure includes an array substrate 1, a flexible printed circuit board 2, a plurality of electrically conductive particles 3, and a system circuit board.

The connection structure may be used in a variety of display panels, such as a liquid crystal panel, a semiconductor light emitting diode panel, an organic light emitting diode panel, and the like.

The array substrate 1 defines a display portion 11 and a fan-out portion 12, and the fan-out portion 12 is positioned at a peripheral portion of the array substrate 1. The display portion 11 provides a plurality of spaced-apart signal lines 111. In the present embodiment, the array substrate 1 is a thin film transistor (TFT) array substrate, the signal lines 111 are connected to the source and the gate (not shown) of the array substrate 1. The signal lines 111 drive the source and the gate by acquiring voltage and signal from the system circuit on the circuit board, thereby achieving the display function on the display portion 11.

The plurality of signal lines 111 at least comprises a first signal line 111a and a second signal line 111b positioned at different height layers, the first and second signal lines 111a, 111b are insulated from each other. The fan-out portion 12 provides a plurality of traces 121 corresponding to the signal lines 111 one by one. The plurality of traces 121 at least comprises a first trace 121a and a second trace 121b positioned at different height layers. The traces 121 adjacent are insulated from each other by insulation layers, and the highest trace layer may not be covered by insulation layer. In order to facilitate the description, the following are illustrated to describe by two signal lines 111 at two different height layers and two traces 121 at two different height layers.

Figure 2:
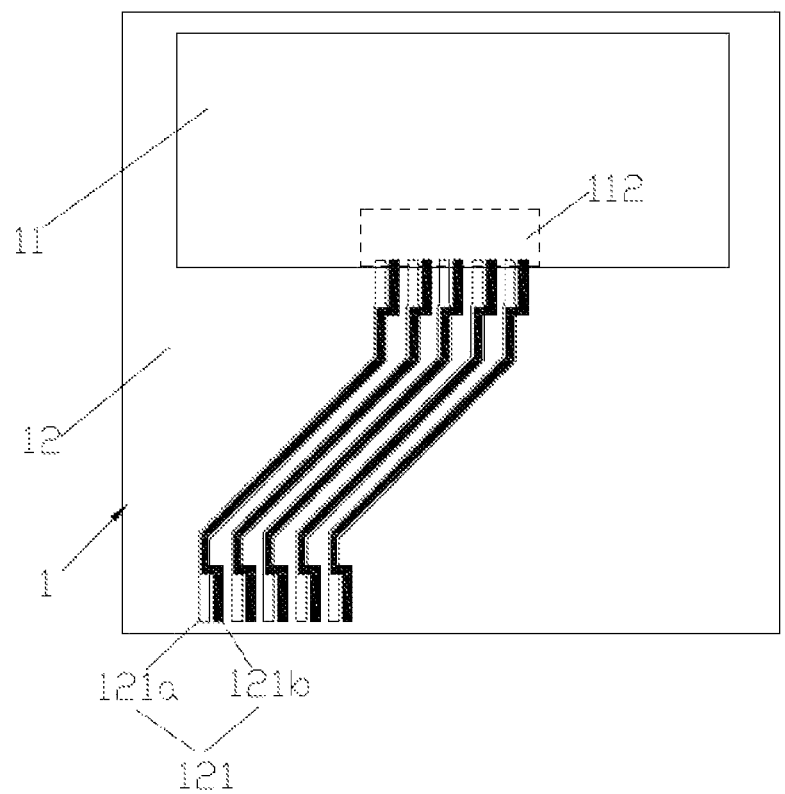
FIG. 2 is a schematic view of traces at a fan-out portion of the array substrate define an overlapped layout, according to an embodiment of the disclosure.
Figure 3:
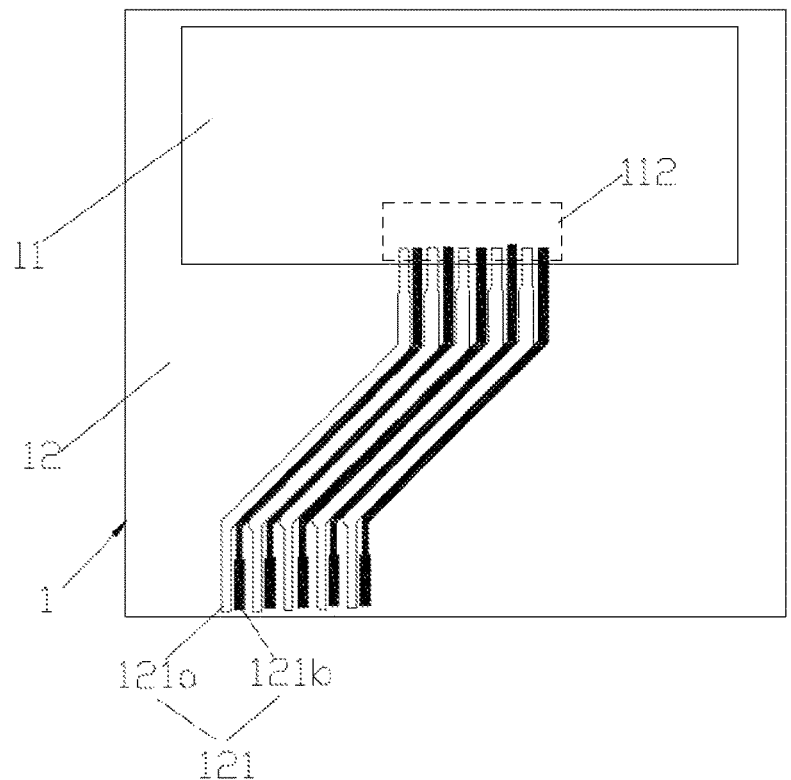
FIG. 3 is a schematic view of traces at a fan-out portion of the array substrate define a neighboring layout, according to an embodiment of the disclosure.

The display portion 11 has a plurality of spaced apart signal lines 111 located at two layers of different heights, and the fan-out portion 12 has a plurality of traces 121 located at two layers of different heights. The traces 121 can be stacked up and down, or can be adjacent left and right. When two traces 121 are stacked up and down, an insulation layer is sandwiched between a top surface of the lower trace 121 and a bottom surface of the upper trace 121, as shown in FIG. 2. In other words, the two stacked traces 121 have overlapped projections. When two traces 121 are adjacent left and right, an insulation layer is sandwiched between a right side of the left trace 121 and a left side surface of the right trace 121, as shown in FIG. 3. In other words, the two adjacent traces 121 have adjacent projections.

One end of each of the signal lines 111 is arranged at a region to form a soldering area 112. One end of each signal line 111 is bonded with one end of each trace 121, so as to electrically connect each other. The above mentioned electrically conductive particles 3 are electrically conductive particles in an anisotropic conductive adhesive film. The flexible printed circuit board 2 defines a plurality of spaced-apart conductive lines 21, corresponding to the traces 121 one by one. In the present embodiment, the flexible printed circuit board 2 is a flip chip, and the conductive lines 21 are copper traces on it. The other end of each of the traces 121 is electrically connected to the conductive lines 21 on the flexible printed circuit board 2, by the electrically conductive particles 3 of the anisotropic conductive adhesive film. The conductive lines 21 of the flexible printed circuit board 2 are electrically connected to conductive traces of the system circuit board, in which the system circuit is defined. So that, the connection structure of the present embodiment implement the electrical connection between the display panel and the system circuit.

Figure 4:
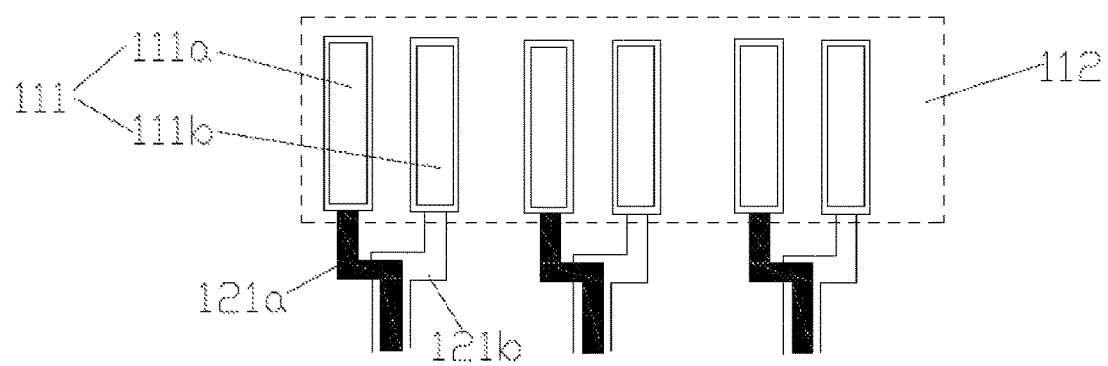
FIG. 4 is a schematic view of signal lines of the array substrate arranged along a line, according to an embodiment of the disclosure.
Figure 5:
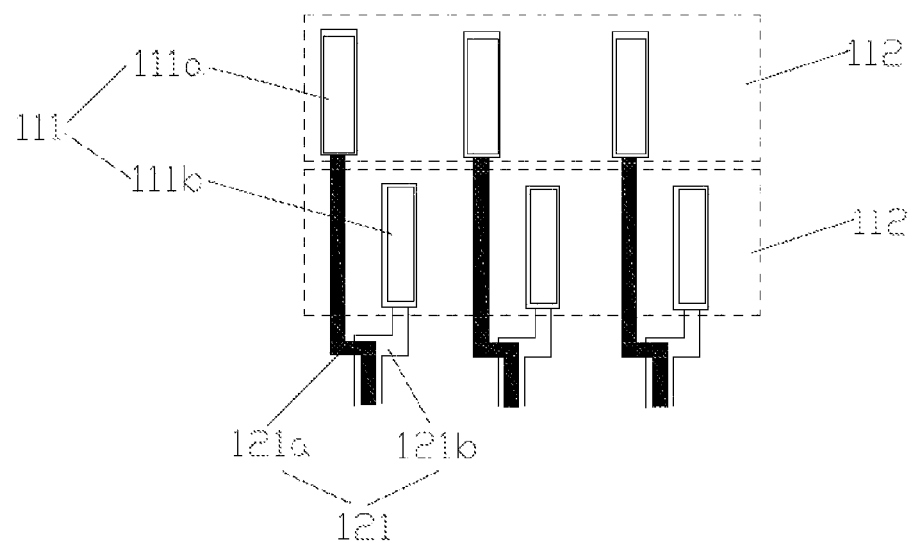
FIG. 5 is a schematic view of signal lines of the array substrate arranged along two lines, according to an embodiment of the disclosure.

The signal lines 111 are arranged along a row, or arranged alternatively along two rows. Referring to FIG. 4, when the signal lines 111 are arranged along a row, two adjacent signal line 111 are alternatively positioned at two neighboring layers with different heights. Referring to FIG. 5, when the signal lines 111 are arranged along two rows, the signal lines 111 at the same row are positioned at the same layer, the signal lines 111 at different rows are positioned at different layers.

The electrically conductive particles 3 have the same diameter. The conductive lines 21 of the flexible printed circuit board 2 are positioned at two different height layers, and two adjacent conductive lines 21 are positioned at two different layers. In order to increase the density of the electrically conductive particles 3, the outer side of the electrically conductive particles 3 is covered with an insulating layer 31, so that the electrically conductive particles 3 can meet the requirements of fine pitch and low on-resistance without occurrence of short out. When the electrically conductive adhesive film is subjected to the hot press process, the insulating layer 31 in the vertical direction is partially broken, so that the conductive lines 21 of the flexible printed circuit board 2 can electrically communicated with the traces 121 of the fan-out portion 12.

In the connection structure provided by the present embodiment, the first signal line 111a and the second signal line 111b are positioned at different height layers, the first trace 121a and the second trace 121b are positioned at different height layers. As such, an up and down staggered wiring structure is formed, and the wiring density is improved. In a same wiring area, the present embodiment achieves at least twice the resolution of integrated circuit requirements compared to conventional designs, and enables a narrower frame design of medium and small size LCD panels to achieve higher resolution.

Figure 6:
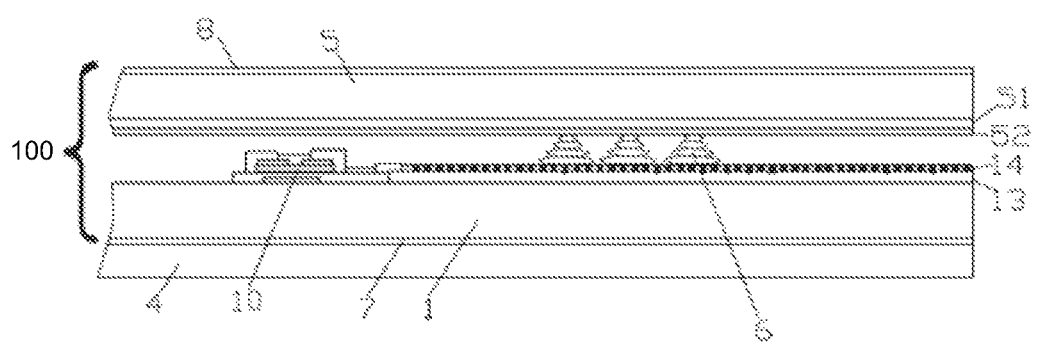
FIG. 6 is a vertical section schematic view of a liquid display device, according to an embodiment of the disclosure.

Referring to FIG. 6, according to an embodiment of the present disclosure, a liquid crystal display panel 100 is provided. The liquid crystal display panel 100 includes an array substrate 1, an opposite substrate 5, a liquid crystal layer 6, a first polarizing plate 7, and a second polarizing plate 8. An inner side of the array substrate 1 provides a first electrode layer 13 having transistors 10 and a first alignment layer 14 covering the first electrode layer 13. The first electrode layer 13 defines a display portion 11 and a fan-out portion 12. The display portion 11 provides a plurality of signal lines 111, the plurality of signal lines 111 at least comprises a first signal line 111a and a second signal line 111b positioned at different height layers, the fan-out portion 12 provides a plurality of traces 121 corresponding to the signal lines 111 one by one. The plurality of traces 121 at least comprises a first trace 121a and a second trace 121b positioned at different height layers, and the first and second traces 121a, 121b are insulated from each other via insulation layers. An inner side of the opposite substrate 5 provides a second electrode layer 51 and a second alignment layer 52 covering the second electrode layer 51. The liquid crystal layer 6 is sandwiched between the first alignment layer 14 and the second alignment layer 52. The first polarizing plate 7 is positioned at the outer side of the array substrate 1. The second polarizing plate 8 is positioned at the outer side of the opposite substrate 5.

One embodiment of the present disclosure further provides a liquid crystal display device, which includes the above mentioned liquid crystal display panel 100 and a backlight module 4. The backlight module 4 is attached on an outer surface of the first polarizing plate 7. That is, the first polarizing plate 7 is sandwiched between the backlight module 4 and the array substrate 1. The backlight module 4 is configured for providing backlighting source.

Figure 7:
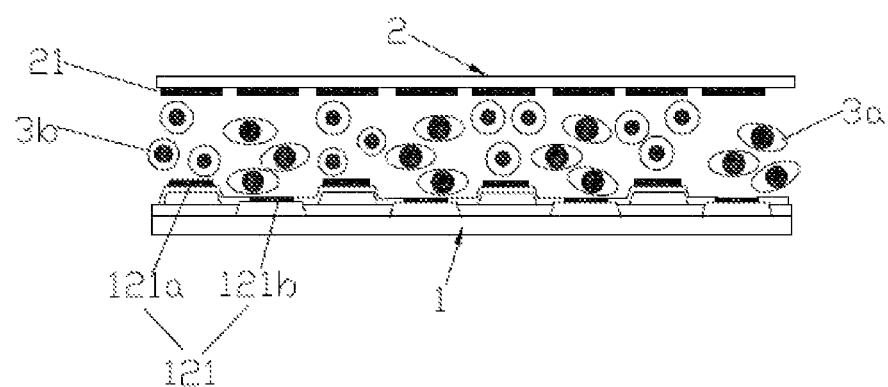
FIG. 7 is a structural schematic view of a connection structure, in which an array substrate and a flexible printed circuit board are communicated with two kinds of electrically conductive particles, according to an embodiment of the disclosure.

Referring to FIG. 7, according to an embodiment of the present disclosure, a connection structure of display panel and system circuit is provided.

The flexible printed circuit board 2 of the present embodiment defines a plurality of conductive lines 21, which are positioned at the same layer. Because the distance between the conductive lines 21 and the traces 121 of the array substrate 1 has two different values, the anisotropic electrically conductive adhesive film includes two kinds of electrically conductive particles 3a, 3b with different diameter. The larger electrically conductive particles 3a are configured for electrically connecting the conductive lines 21 and the traces 121 with a larger distance. The smaller electrically conductive particles 3b are configured for electrically connecting the conductive lines 21 and the traces 121 with a shorter distance.

In the connection structure provided by the present embodiment, the first signal line 111a and the second signal line 111b are positioned at different height layers, the first trace 121a and the second trace 121b are positioned at different height layers. As such, an up and down staggered wiring structure is formed, and the wiring density is improved. In a same wiring area, the present embodiment achieves at least twice the resolution of integrated circuit requirements compared to conventional designs, and enables a narrower frame design of medium and small size LCD panels to achieve higher resolution.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A connection structure of a display panel and a system circuit, comprising:
   an array substrate comprising a display portion and a fan-out portion, wherein the display portion provides a plurality of signal lines, the plurality of signal lines at least comprises a first signal line and a second signal line positioned at different height layers, the first and second signal lines are insulated from each other, the fan-out portion provides a plurality of traces corresponding to the signal lines, the plurality of traces at least comprises a first trace and a second trace positioned at different height layers, and the first and second traces are insulated from each other;
   a printed circuit board comprising a plurality of conductive lines spaced from each other;
   a plurality of electrically conductive particles, wherein one end of each trace is electrically connected with one corresponding signal line, and the other end of each trace is electrically connected with one conductive line via electrically conductive particles.

2. The connection structure according to claim 1, wherein the printed circuit board is a flexible printed circuit board.

3. The connection structure according to claim 2, wherein the connection structure further comprises a system circuit board, which provides a plurality of conductive traces electrically communicated with the conductive lines.

4. The connection structure according to claim 1, wherein the display portion defines a peripheral soldering area, the signal lines are positioned at the soldering area.

5. The connection structure according to claim 4, wherein the signal lines arranged along a row at the soldering area.

6. The connection structure according to claim 5, wherein the first signal line and the second signal line are adjacent.

7. The connection structure according to claim 6, wherein the electrically conductive particles have the same diameter and are positioned in an anisotropic conductive adhesive layer, the electrically conductive particles are insulated from each other by insulation material surrounded each electrically conductive particle.

8. The connection structure according to claim 1, wherein the display portion defines a first soldering area and an adjacent second soldering area, half signal lines arranged along a first row at the first soldering area, the other half signal lines arranged along a second row at the second soldering area.

9. The connection structure according to claim 8, wherein the first soldering area and the second soldering area are positioned at different height layers.

10. The connection structure according to claim 9, wherein the first signal line is positioned at the first soldering area, and the second signal line is positioned at the second soldering area.

11. The connection structure according to claim 1, wherein the electrically conductive particles are positioned in an anisotropic conductive adhesive layer, in which the electrically conductive particles are insulated from each other by insulation material surrounded each electrically conductive particle, and the anisotropic conductive adhesive layer is positioned sandwiched between the conductive lines and the traces.

12. The connection structure according to claim 11, wherein the electrically conductive particles have the same diameter.

13. The connection structure according to claim 11, wherein the electrically conductive particles have two different diameters, and the conductive lines are positioned at the same layer of the printed circuit board.

14. The connection structure according to claim 11, wherein an insulation layer surrounds and covers each of the electrically conductive particles.

15. The connection structure according to claim 1, wherein the first trace and the second trace are positioned at two neighbor layers, and the projections of the first trace and the second trace are overlapped.

16. The connection structure according to claim 1, wherein the first trace and the second trace are positioned at two neighbor layers, and the projection of the first trace is adjacent to the projection of the second trace.

17. A liquid crystal display panel, comprising:
   an array substrate, wherein an inner side of the array substrate provides a first electrode layer having transistors and a first alignment layer covering the first electrode layer, the first electrode layer defines a display portion and a fan-out portion, the display portion provides a plurality of signal lines, the plurality of signal lines at least comprises a first signal line and a second signal line positioned at different height layers, the fan-out portion provides a plurality of traces corresponding to the signal lines one by one, the plurality of traces at least comprises a first trace and a second trace positioned at different height layers, and the first and second traces are insulated from each other;

an opposite substrate, an inner side of the opposite substrate providing a second electrode layer and a second alignment layer covering the second electrode layer;

a liquid crystal layer positioned between the first alignment layer and the second alignment layer;

a first polarizing plate provided at the outer side of the array substrate; and a second polarizing plate provided at the outer side of the opposite substrate.

18. A liquid crystal display device, comprising:

an array substrate, wherein an inner side of the array substrate provides a first electrode layer having transistors and a first alignment layer covering the first electrode layer, the first electrode layer defines a display portion and a fan-out portion, the display portion provides a plurality of signal lines, the plurality of signal lines at least comprises a first signal line and a second signal line positioned at different height layers, the fan-out portion provides a plurality of traces corresponding to the signal lines one by one, the plurality of traces at least comprises a first trace and a second trace positioned at different height layers, and the first and second traces are insulated from each other;

an opposite substrate, an inner side of the opposite substrate providing a second electrode layer and a second alignment layer covering the second electrode layer;

a liquid crystal layer positioned between the first alignment layer and the second alignment layer;

a first polarizing plate provided at an outer side of the array substrate;

a second polarizing plate provided at an outer side of the opposite substrate; and a backlight module configured for providing backlighting.

19. The liquid crystal display device according to claim 18, wherein the liquid crystal display device further comprises a printed circuit board and a plurality of electrically conductive particles, the printed circuit board comprises a plurality of conductive lines spaced from each other, one end of each trace is electrically connected with one corresponding signal line, and the other end of each trace is electrically connected with one conductive line via the electrically conductive particles.

20. The liquid crystal display device according to claim 18, wherein the first polarizing plate is sandwiched between the backlight module and the array substrate.

* * * * *